United States Patent
Hennig et al.

(10) Patent No.: US 6,975,034 B2
(45) Date of Patent: Dec. 13, 2005

(54) SEMICONDUCTOR MODULE

(75) Inventors: Petra Hennig, Stadtroda (DE); Guido Bonati, Holzkirchen (DE); Ulrich Rollig, Jena (DE); Dirk Lorenzen, Jena (DE)

(73) Assignee: Jenoptik Laserdiode GmbH, Jena (DE)

( * ) Notice: Subject to any disclaimer, the term of this patent is extended or adjusted under 35 U.S.C. 154(b) by 165 days.

(21) Appl. No.: 10/464,850

(22) Filed: Jun. 19, 2003

(65) Prior Publication Data
US 2004/0113276 A1 Jun. 17, 2004

(30) Foreign Application Priority Data
Jul. 2, 2002 (DE) .......................................... 102 29 712

(51) Int. Cl.⁷ .............................................. H01L 23/48
(52) U.S. Cl. ........................ 257/762; 257/762; 257/758
(58) Field of Search ................................ 257/762, 758, 257/750, 81, 88, 276, 625, 676

(56) References Cited

U.S. PATENT DOCUMENTS

| | | | | | |
|---|---|---|---|---|---|
| 4,758,926 | A | * | 7/1988 | Herrell et al. ............... | 361/699 |
| 5,903,583 | A | * | 5/1999 | Ullman et al. ................ | 372/35 |
| 6,252,726 | B1 | * | 6/2001 | Verdiell ...................... | 359/820 |
| 6,676,306 | B2 | * | 1/2004 | Ikeda et al. ................... | 385/92 |

* cited by examiner

Primary Examiner—David Nelms
Assistant Examiner—Thinh T Nguyen
(74) Attorney, Agent, or Firm—Hoffman Wasson & Gitler, PC

(57) ABSTRACT

The invention refers to a novel semiconductor module with at least one semiconductor element in the form of a laser diode or laser diode arrangement, whereby the semiconductor element is provided with an area of a multi-layer substrate, which at least in a partial area is designed as a micro-cooler through which cooling medium flows, and which has connectors for supplying and discharging cooling medium.

34 Claims, 11 Drawing Sheets

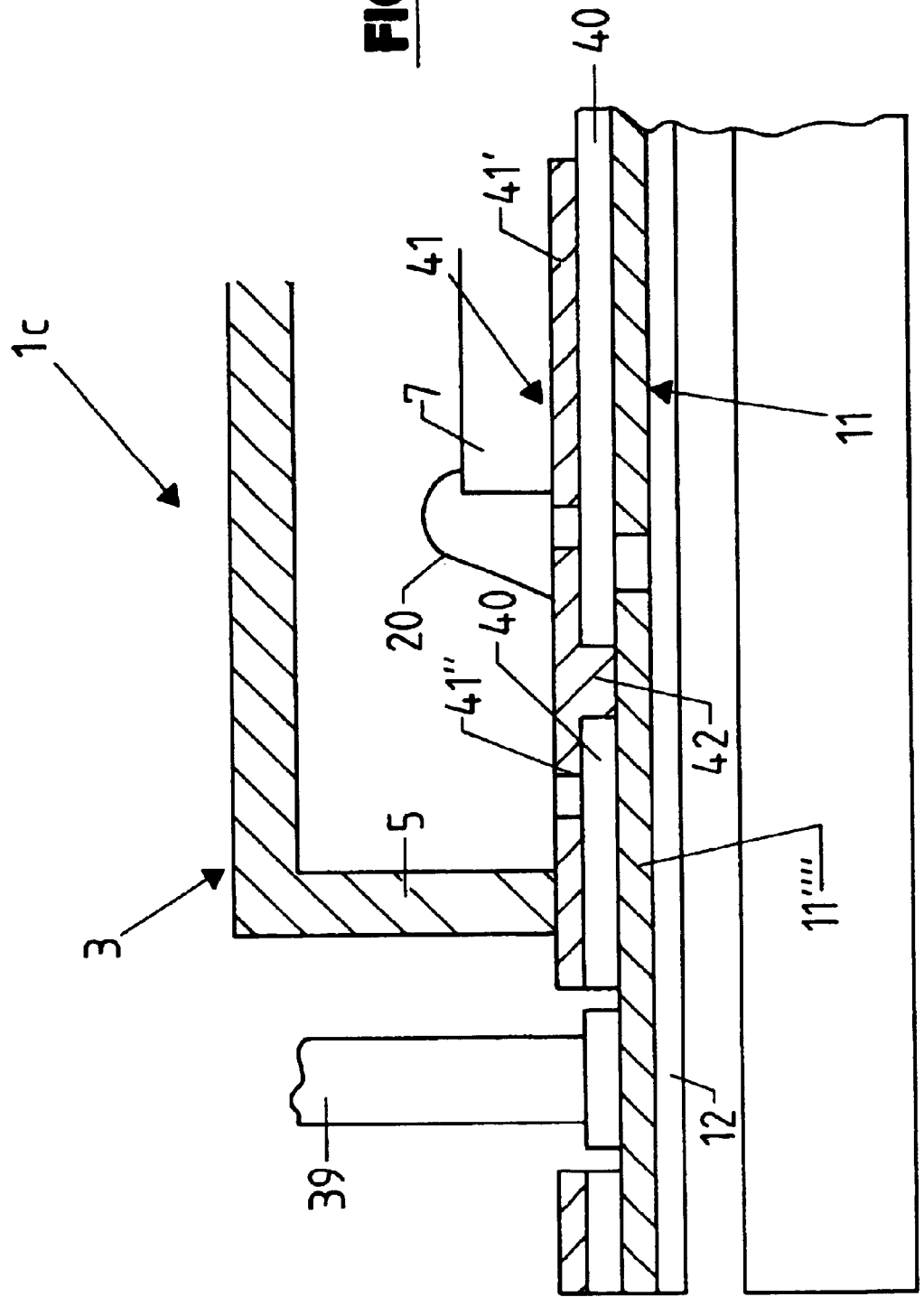

SEMICONDUCTOR MODULE

Figure 1:
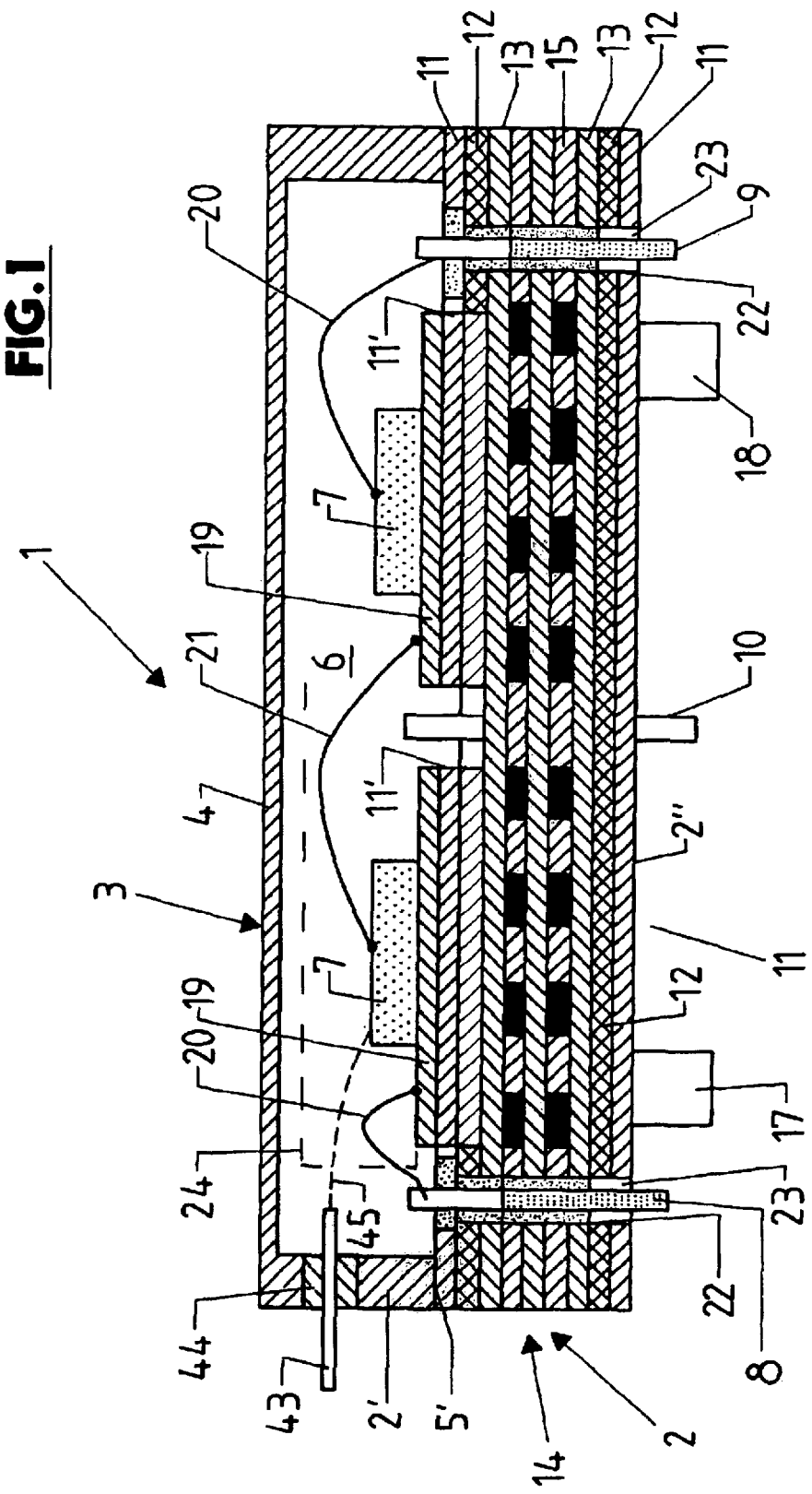

This invention refers to a semiconductor module having at least one semiconductor element formed as a laser diode or a laser diode system, whereby the semiconductor element is provided on an area of a multi-layer substrate, which at least in a partial area is formed as a micro-cooler through which a cooling medium is passed, and which is provided with terminals for supplying and discharging cooling medium.

It is known in the art to produce the metallizing layer required with ceramic metal substrates for conductor paths, connectors, etc. on a ceramic structure, for example an aluminum oxide ceramic by means of the so-called "DCB method" (direct-copperbond-technology) using metal or alternatively copper foils or metal or alternatively copper sheets forming the metallization layer, which films or sheets are provided at their upper surfaces with a layer or a coating (hot-melt layer) made of a chemical composition of the metal and a reactive gas, preferably oxygen. With this method described for example in U.S. Pat. No. 3,744,120 or in DE Patent 23 19 854 this layer or coating (hot-melt layer) forms an eutecticum with a melting temperature below the melting temperature of the metal (f.e. copper) so that by applying the film onto the ceramic unit and by heating all layers said layers can be bonded with each other by hot-melting the metal or copper substantially in the area of the hot-melt layer or oxide layer only.

Said DCB method f.e. comprises the following method steps:

Oxidizing a copper film in such a manner that a continuous copper oxide layer is obtained;

applying the copper film onto the ceramic layer;

heating the compound to a processing temperature between approx. 1025° and 1083° C., for example 1071° C.;

cooling down the product to room temperature.

Moreover, so-called micro-coolers (DE 197 10 783 A1) are known which consist of a plurality of metal plates, f.e. copper plates stacked one above the other, and which by means of the DCB method are bonded with each other along their surface. With the exception of the outermost metal layers the metal layers between are structured each, which means are provided with a plurality of apertures and webs surrounding them, namely in such a manner that within this area of the micro-cooler formed by said structured metal layers a micro-cooler structure is obtained, through which cooling medium is passed; the micro-cooler structure is characterised by a three-dimensionally branching flow path for the cooling medium.

It is an object of the invention to propose a semiconductor module, such as a semiconductor diode laser module which with a high degree of liability in operation guaranties optimum cooling for the used semiconductor element (laser diode or laser diode bar).

For solving this object the invention proposes a semiconductor module in which at least one semiconductor element is arranged within a space which is separate from the cooling medium terminals and can be hermetically locked.

The semiconductor module according to the subject invention allows among others a perfect separation between the cooling area, especially between the micro-cooler structure with the connectors for supplying and discharging the cooling medium, and that area within which the at least one semiconductor element is provided.

By using the micro-cooler structure with high cooling power a small volume and compact construction of the semiconductor module is possible. Especially, large-volume heat spreaders can be avoided. Rather, fixing the related semiconductor element on a relatively thin fastening and connector plate at a relatively thin, metallic fixture area is possible which can be realized in an economical manner by means of a structured metal layer or film.

By means of the micro-cooler also with a large area design of the cooler or the substrate forming said cooler, especially also with a plurality of semiconductor elements provided on said substrate, a most continuous cooling effect can be obtained for all of the structural elements. Normal water can be used as a cooling medium for the semiconductor module according to this invention.

Figure 2:
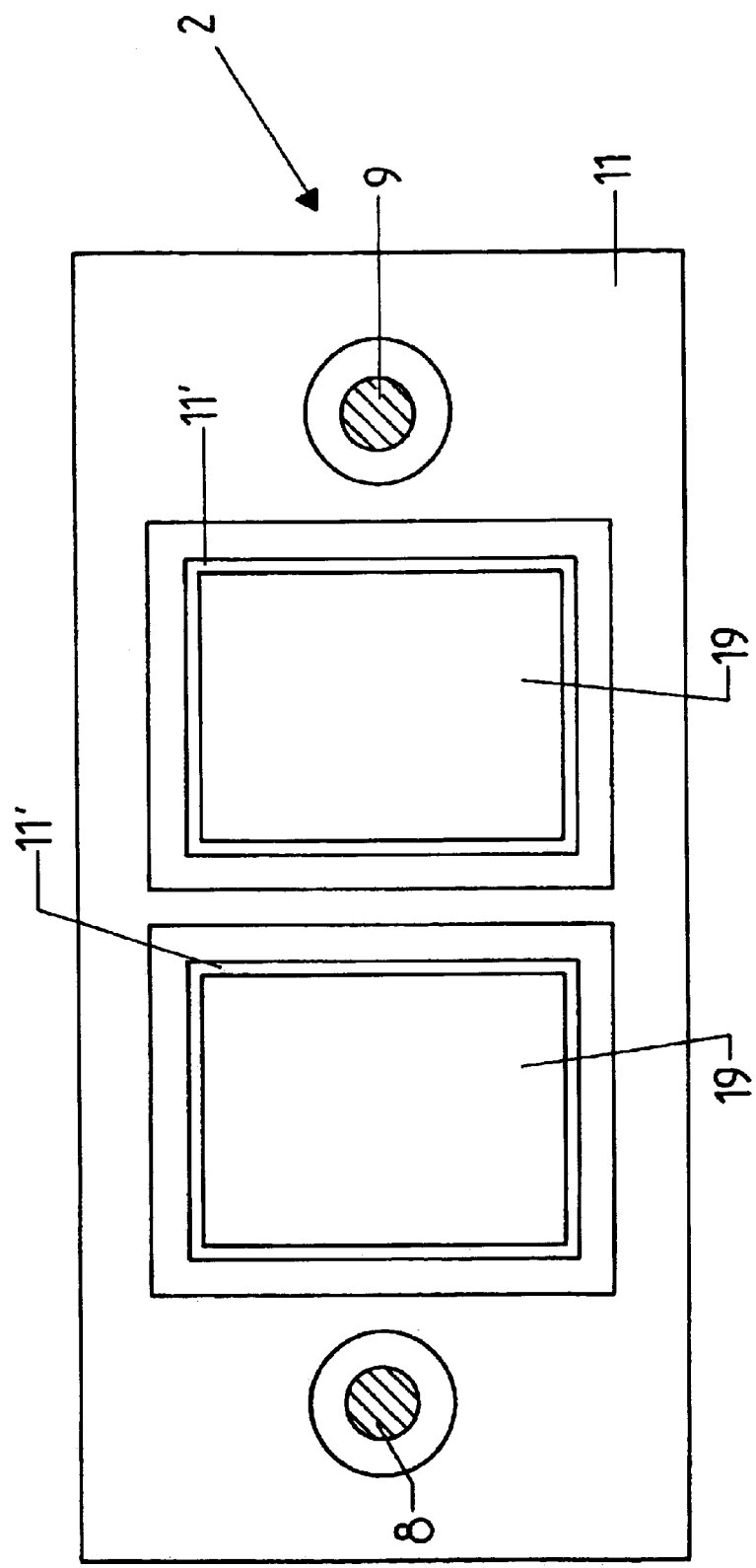
Figure 3:
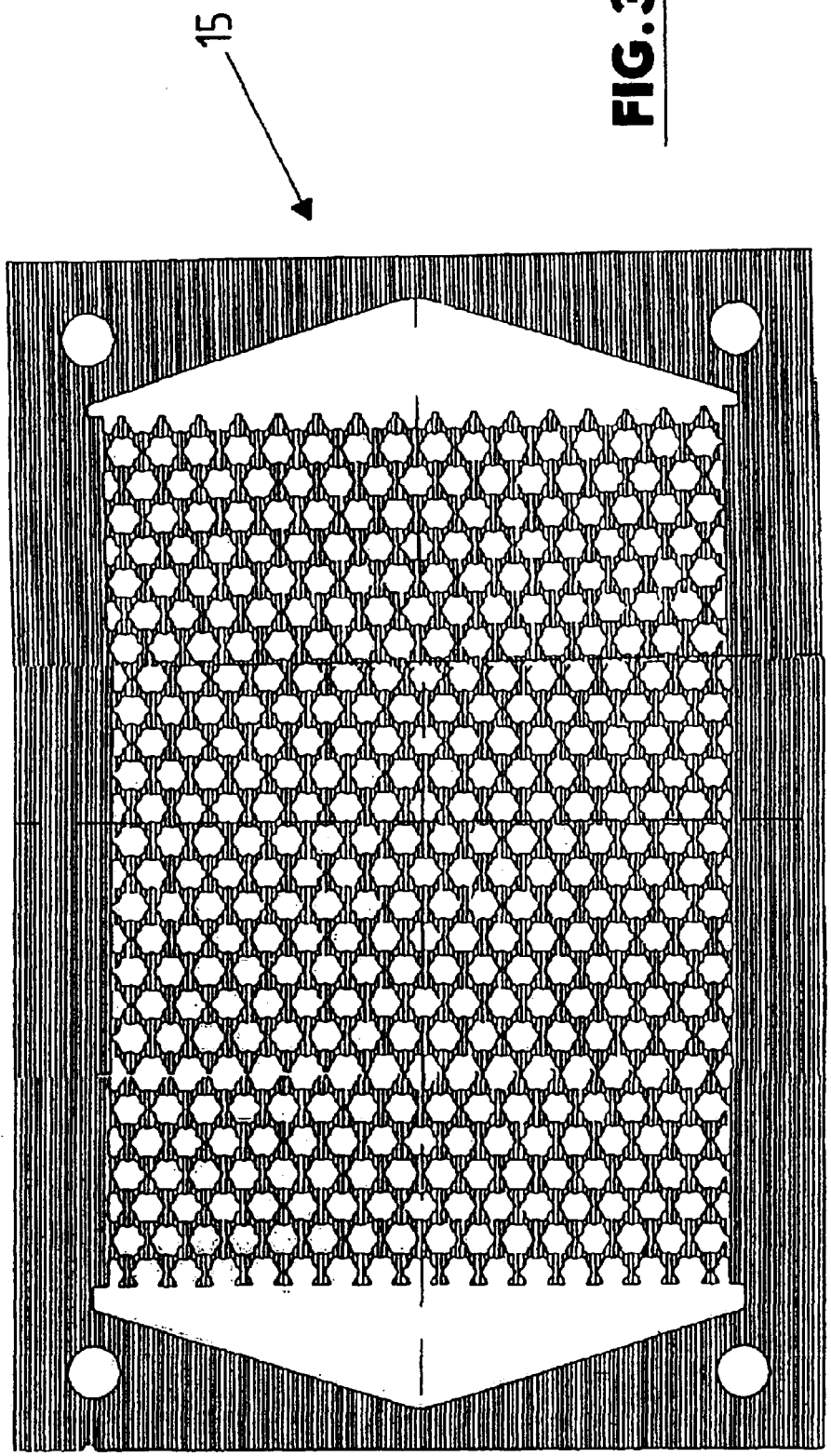
Figure 4:
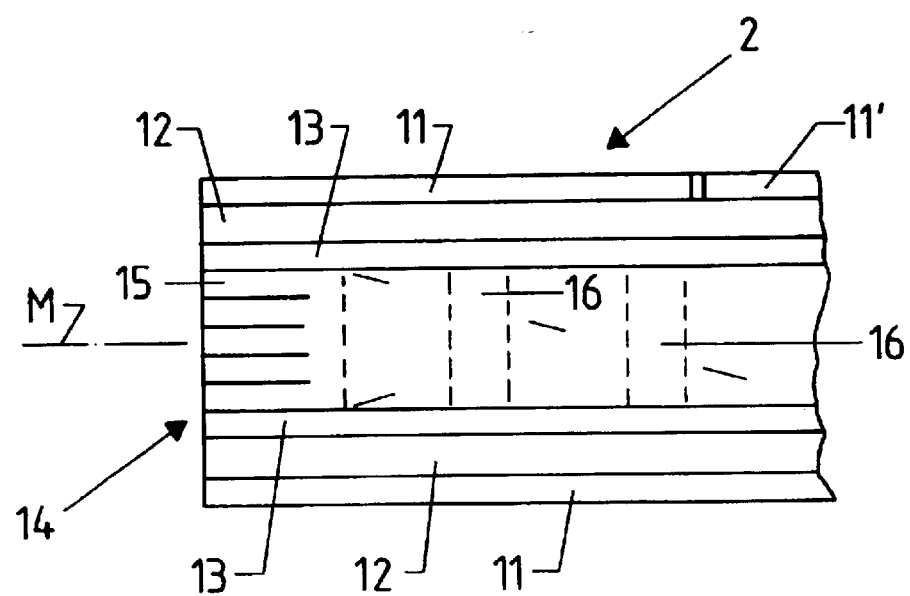
Figure 5:
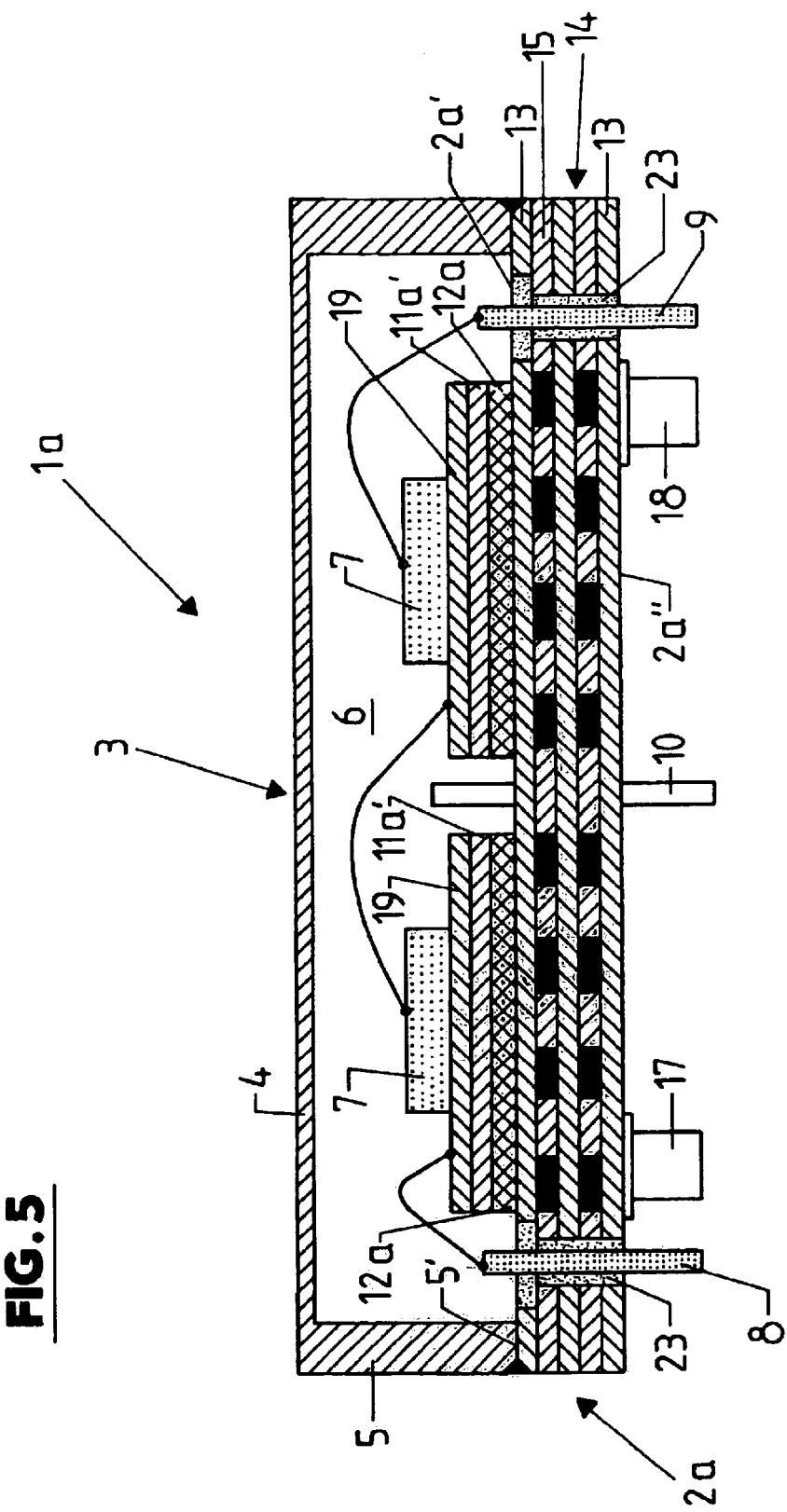
Figure 6:
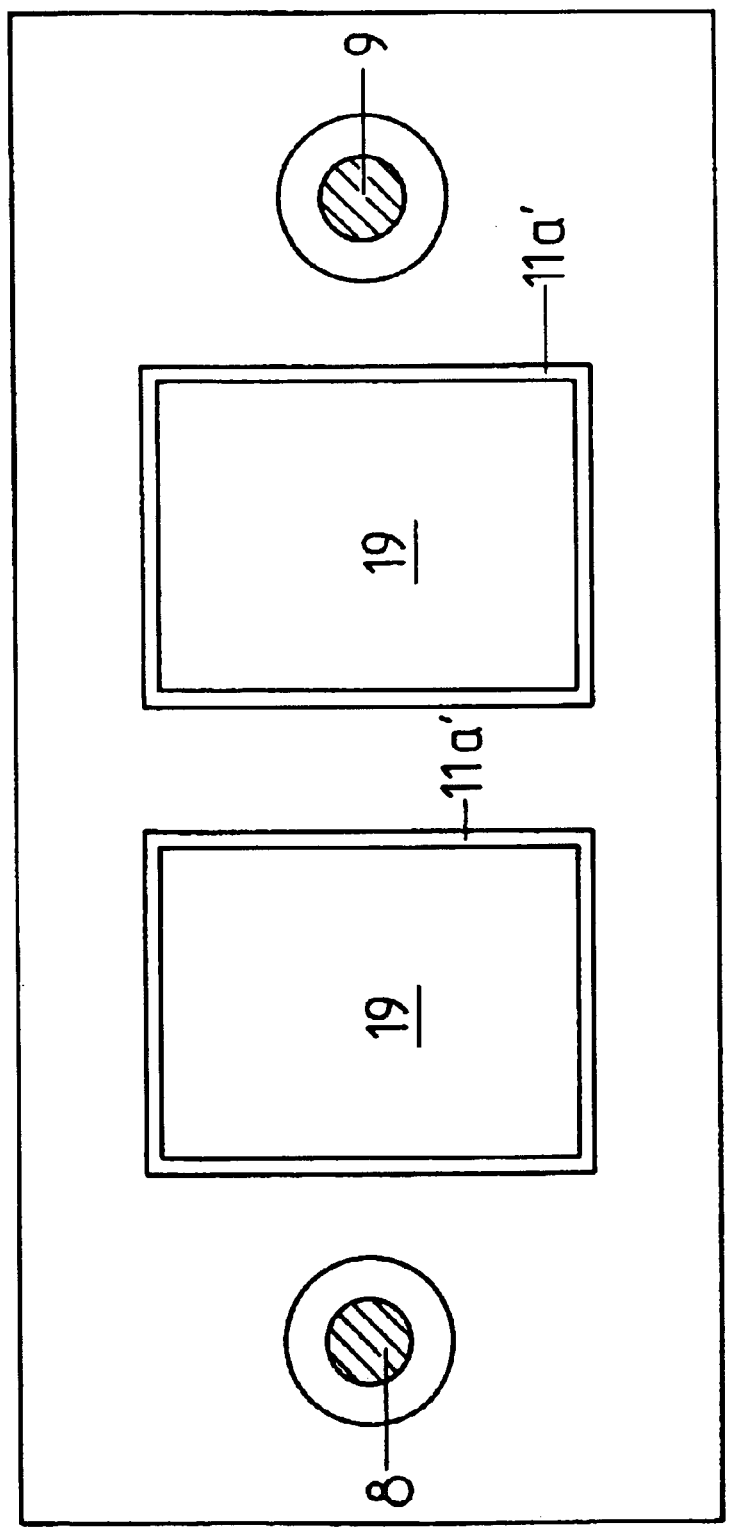
Figure 7:
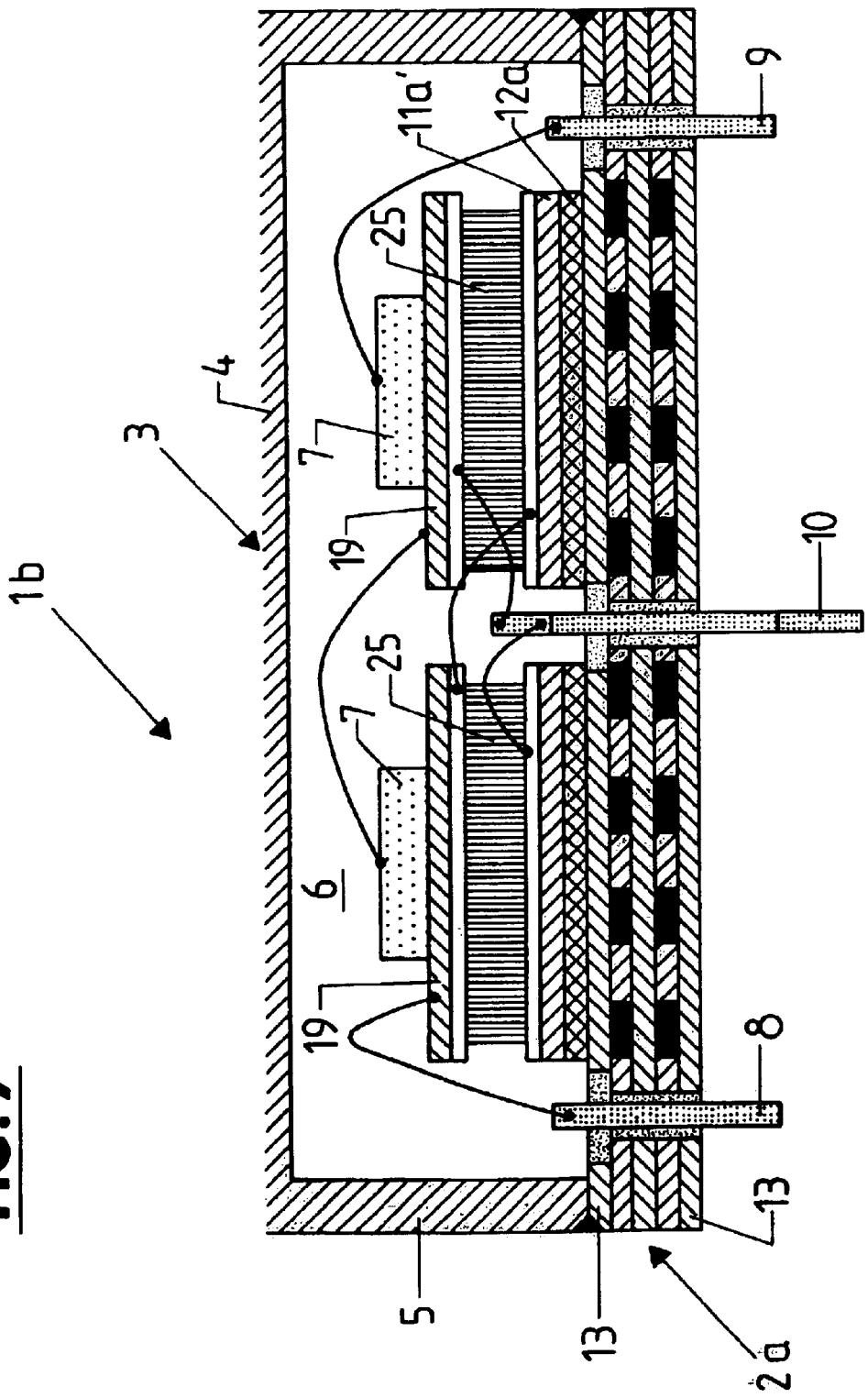
Figure 8:
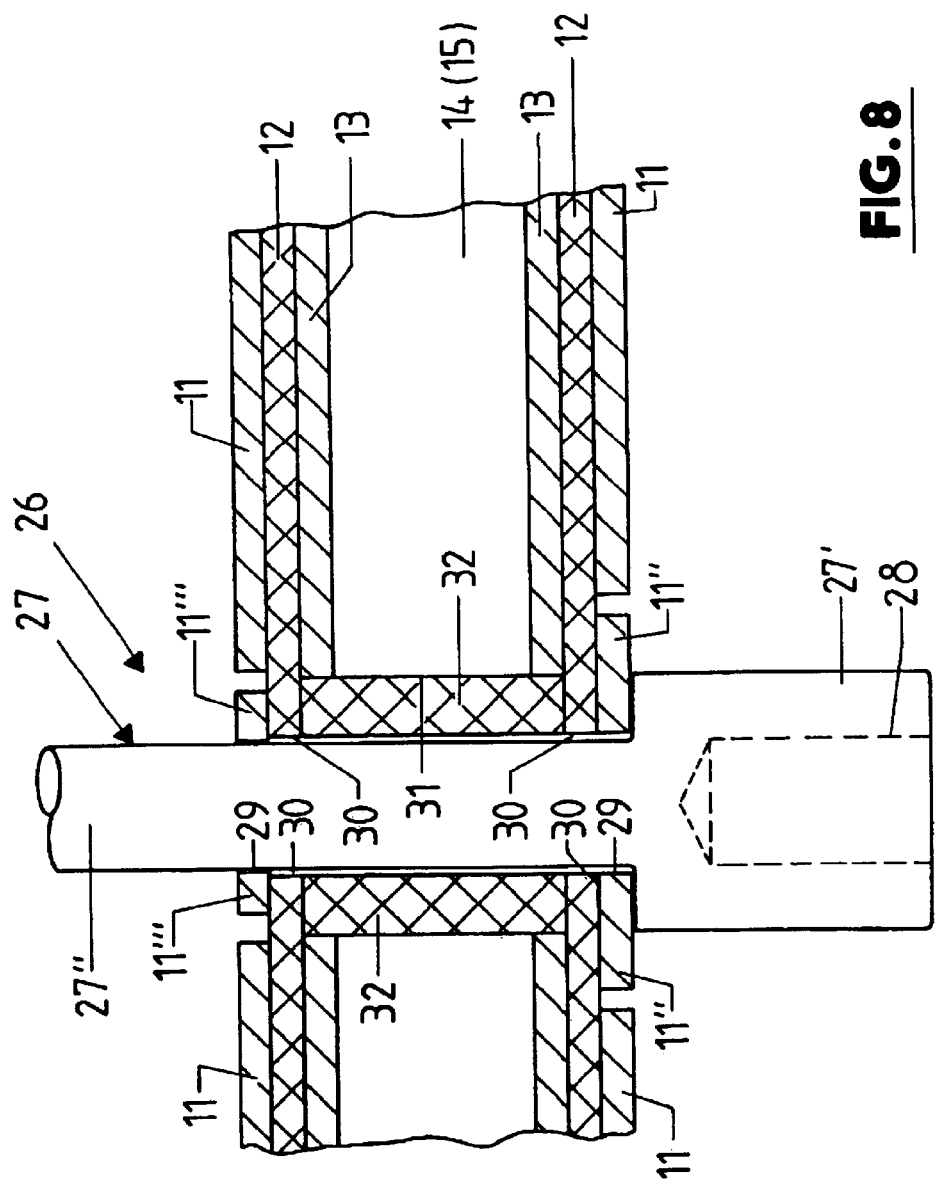
Figure 9:
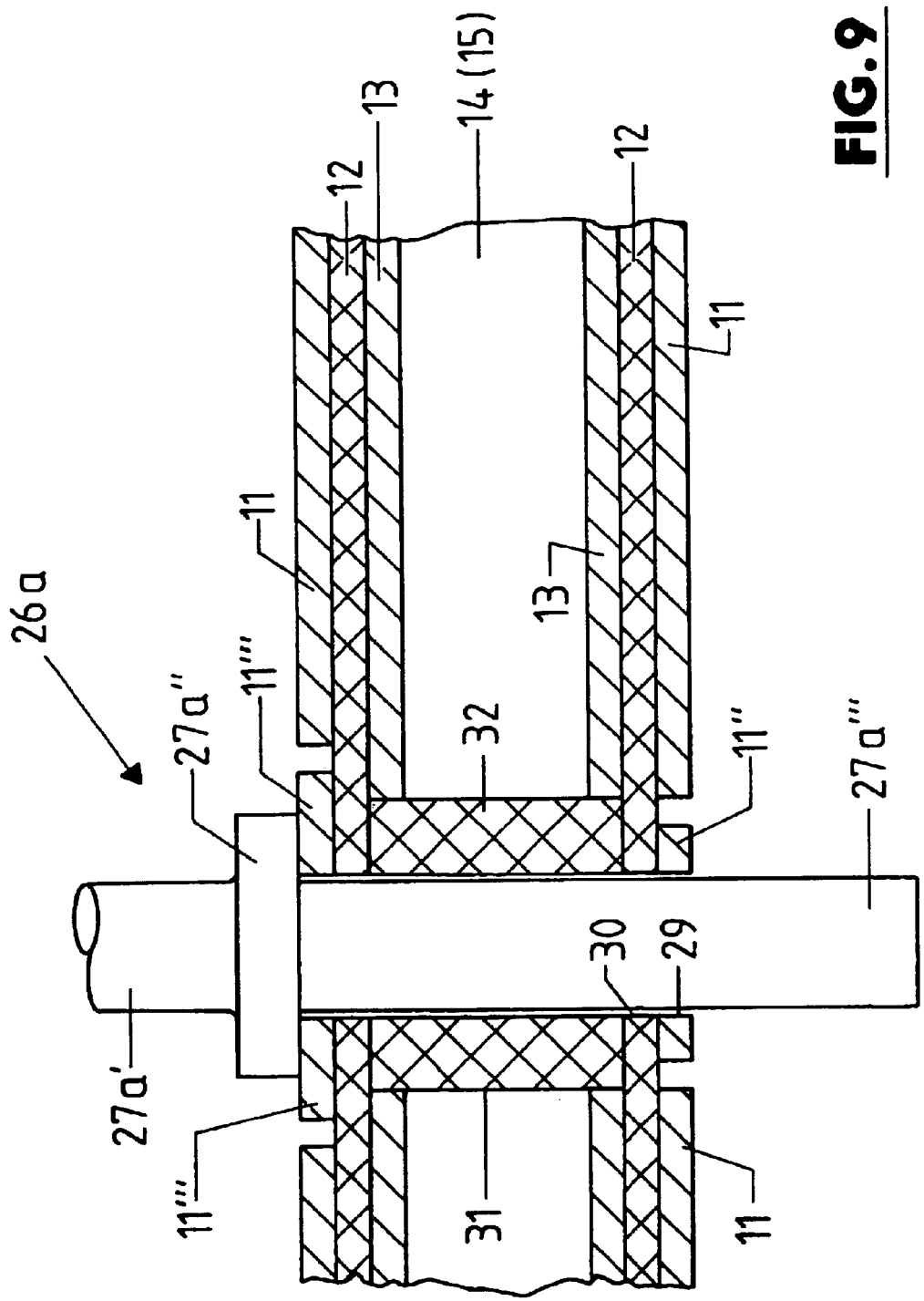
Figure 10:
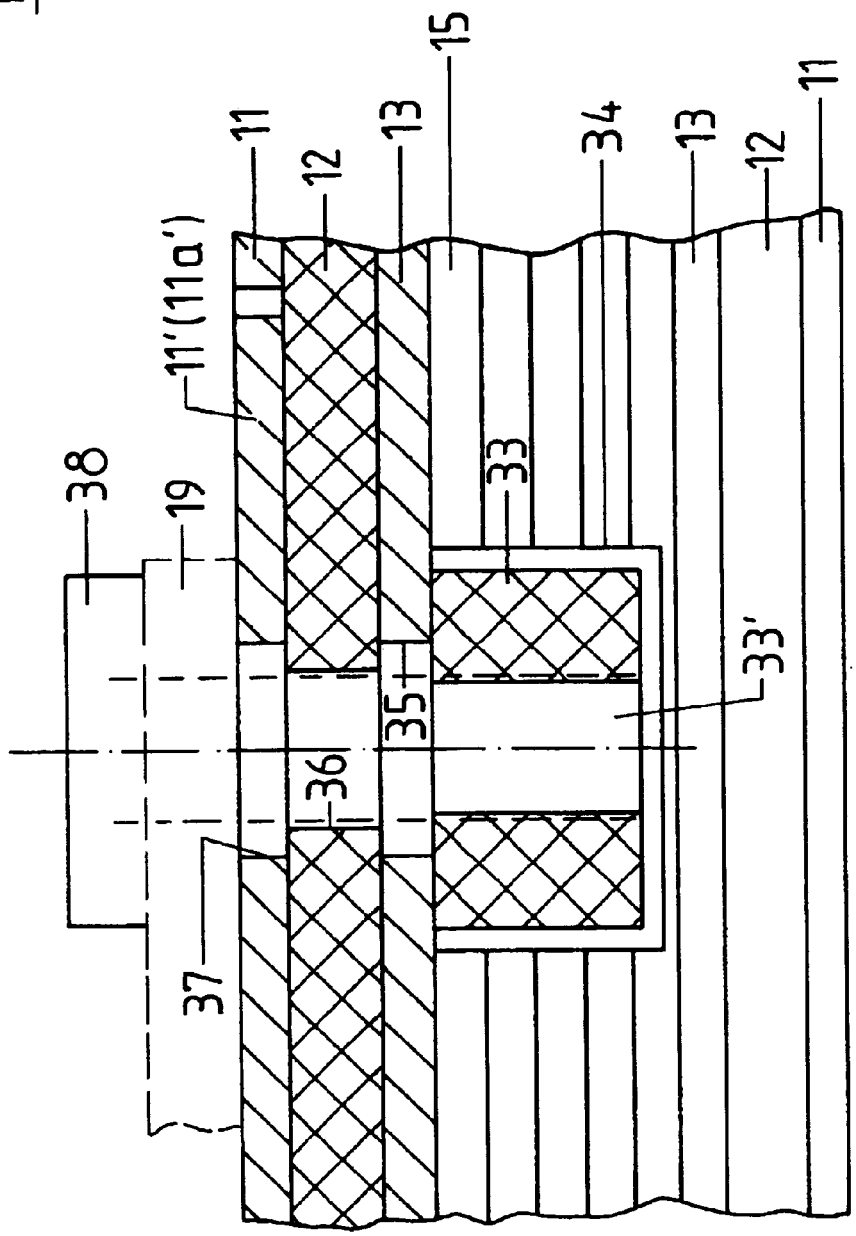

Further embodiments of the invention are the subject of subclaims. In the following the invention will be described in connection with the figures of the drawing by embodiments which show:

FIG. 1 a semiconductor power module according to the invention in simplified representation and in cross-section;

FIG. 2 a top view on the upper side of the substrate with a plurality of layers designed as a micro-cooler according to the module of FIG. 1;

FIG. 3 in an individual representation and in top view a structured metal layer of the micro-cooler according to FIGS. 1 and 2;

FIG. 4 in an enlarged partial view a cross-section through the layers of the micro-cooler of FIG. 1;

FIGS. 5 and 6 in representations similar to those ones of FIGS. 1 and 2 a further possible embodiment of the module according to the invention;

FIG. 7 in cross-section view similar to FIG. 1 a further embodiment of the module according to the invention;

FIGS. 8 and 9 in enlarged, detailed representation a section each through the micro-cooler around an electrical connector for the semiconductor elements (bearing in mind that there are numerous other embodiments of the invention);

FIG. 10 in an enlarged representation screw fastening means for fastening a supporting and connector plate of a semiconductor element for the module according to the invention;

FIG. 11 a cross-sectional view similar to FIG. 1 of a further embodiment of the semiconductor module according to the invention.

The semiconductor module 1 of FIG. 1 comprises (among others) a plate-type multi-layer substrate or micro-cooler 2, a pot-like casing 3 provided on the upper side 2' of the micro-cooler 2 which casing has a bottom 4 arranged parallel or substantially parallel to the micro-cooler 2 and positioned distant from bottom 4, and a wall 5 of the casing. Casing 3 is sealingly connected with the other side of the micro-cooler 2 on said wall or its free edge 5' so that an interior space 6 of the casing is formed which is outwardly restricted by the bottom 4 of the casing, its edge 5 and the upper side 2' is hermetically closed. In this interior space 6 of the casing two power semiconductor elements 7 are provided with the semiconductor module 1, namely in the form of laser diode bars with several active areas or laser diodes each.

For supplying the semiconductor elements 7 with current and voltage which elements according to the shown embodiment are connected in series, two electrical connectors 8 and 9 are provided which are passed electrically insulated through the micro-cooler 2 and are passed away from the underside 2" of the micro-cooler 2 opposite to casing 3. The underside 2" also forms the underside 10 of the semiconductor module 1. A further connector 10 is shown which is also electrically insulated and is passed through the micro-cooler 2; this connector is for example a measuring contact.

The micro-cooler 2 is structured multilayered, which means that it consists of a number of layers. In view of the type and the arrangement of said layers the micro-cooler 2 with this embodiment is arranged symmetrically to a virtual center plane M arranged parallel to the upper side 2' and the underside 2". In this sense the micro-cooler 2 of the shown embodiment starting from the upper side 2', and also starting from the underside 2" is provided with an outer metal layer 11, and is followed by a ceramic layer 12 and further followed by a metal layer 13. Between the metal layers 13 the area 14 (micro-cooler structure) of the micro-cooler 2 is formed, through which a cooling medium, preferably a liquid cooling medium such as water is passed. This area consists of several structured metal layers 15 (see FIG. 3) which by means of a their structure form three-dimensional branching channels for the cooling medium. Structuring the metal layers 15 is also designed so that the metal layers 15 form through-going columns 16 around which cooling medium flows between the interior metal layers 13, as this is shown in FIG. 4 by 16. For structuring the metal layers 15 very different methods are suitable, among others edging methods, laser cutting, water jet cutting, punching etc.

The metal layers 11, 13 and 15 are of the same thickness in the shown embodiment. On the underside 2" two connectors 17 and 18 are provided for supplying and for discharging the cooling medium into the area 14 resp. from this area. The individual layers 11, 12, 13 and 15 are connected with each other along their full surfaces by means of DCB-technique.

This type of micro-cooler has an extremely high heating power with low volume of structure, the more because the interior cooling surface of the area 14 which is passed by the cooling medium, is many times larger than the outer cooling surface, which means the surface formed at the upper side 2' for cooling the semiconductor elements 7. By means of the columns 16 the micro-cooler 2 has a high stability against vaulting of its upper side 2', especially also under temperature changes and/or pressure changes within the micro-cooler 2. Because of it's symmetrical structure in relation to the center plane M the micro-cooler under temperature changes is prevented from being deformed or vaulted in its entirety (bimetal effect). This termal rigidity is amplified by the casing 3.

As shown in FIG. 2 the metal layer 11 on the upper side 2' is structured so that there are two islands or fixing areas 11' which with the shown embodiment have a square shape and are electrically separated from each other and also from the remaining part of said metal layer 11. On each area 11' is fastened a supporting or connecting plate 19 made from electrically conductive material, for example copper, on which the corresponding semiconductor element 7 is fastened in a suitable manner, f.e. is soldered thereon. The supporting plate 19 has a cut-out the dimensions of which are equal or slightly smaller than the dimensions of the area 11. By means of wire bonds or other internal connectors 20 and 21 the semiconductor elements 7 are connected with the outer connectors 8 or 9 as well with each other.

For passing through the connectors 8–10 consisting of electrically conductive material in an electrically insulating manner within the micro-cooler 2 or within the layers 11, 13 and 15 thereof coinciding bores 22 are provided; within each bore 22 a sleeve-like insertion 23 of electrically insulating material, f.e. ceramic material, is inserted and is fastened in a suitable manner; the corresponding connector 8–10 is supported within said insertion in such a manner that each connector extends over the upper side 2' and the underside 2". The bores 22 are provided outside of the structuring area resp. the apertures within the metal layers 15. Fastening the inserts 23 within the micro-cooler 2 is f.e. performed also by means of the DCB-technique, however, can also be effected in any other suitable manner.

Laser light emitting from the semiconductor elements designed as laser diodes a window 24 is provided within the wall 5 of the casing; the window opening is closed by glass so that the exit of light is possible, however, the interior space 6 of the casing, but also around the window 24 is hermetically closed.

Casing 3 for example is also made of metal. Basically, there is the possibility to manufacture this casing of temperature-resistant plastics material, preferably with a coating of metal. It is also possible to make the casing of ceramic material. The connection between the casing 3 and the micro-cooler 2 can be realised in most different ways, f.e. by welding, soldering, glueing, etc.

The basic advantages of the semiconductor module 1 among others are:

A small volume construction with optimum cooling effect by the micro-cooler 2, whereby especially large and large-volume heat spreaders are avoided;

extremely low conductivity of heat between the semiconductor elements 7 to be cooled and the micro-cooler 2 as well within the cooler, especially also by using DCB-technique so that low operating temperatures of the semiconductor elements 7 are obtained;

possibility of a sealed arrangement of the semiconductor elements 7 by continuous and effective cooling;

stable operating temperature for the semiconductor elements 7 by effective cooling;

entire separation of the semiconductor elements 7 or the interior space of casing 6, especially by using through-going layers 11–13 of the micro-cooler structure and supplyind and discharging the cooling medium (connectors 17 and 18) provided at the underside 2';

hermetical, especially also gas-tight closure of the interior space 6 of the casing including the semiconductor elements 7;

keeping the casing 3 and the micro-cooler 2 free of potential, especially also by means of insulated passing through of the connectors 8–10 and arranging the semiconductor elements 7 resp. their supporting plates 19 on the insulated areas 11' so that a series connection of the semiconductor elements 7 is possible.

FIGS. 5 and 6 show a semiconductor module 1a in similar representation as FIGS. 1 and 2 of another embodiment of the invention, which differs from semiconductor module 1 substantially in that instead of the micro-cooler 2 the micro-cooler 2a is provided which consists of the metal layers 13 and 15, which are connected with each other along their surface by means of the DCB technique. The upper side 2a' of the micro-cooler 2a is formed by the surface side of the upper layer 13 opposite to layer 15, the underside 2a" is formed by the upper surface side of the lower layer 13 opposite to the layers 15.

On the upper side 2a' a plurality of areas 11' corresponding to fixing areas 11a' are provided, each of which is electrically separated from the layer 13 underneath by a ceramic layer 12a. The ceramic layers 12a with the shown embodiment have in top view the same cut-out as the corresponding area 11a' formed by a metal layer, whereby the dimensions of the ceramic layers 12a are slightly larger than the dimensions of the corresponding areas 11a'. Connections between the ceramic layers 12a and the metallic layer 13 forming the upper side 2a as well the connection between the corresponding area 11a' with the associated ceramic layer 12a are implemented again by means of the direct-bonding-technique. For reasons of symmetry, which means for increasing the stability against unwanted vaulting of the micro-cooler 2a caused by temperature changes (bimetal effect) also with this type of micro-cooler more layers can be provided on the lower metal layer 13, namely a ceramic layer and subsequent thereto the further metallic layer, which with this type of embodiment forms the underside of the micro-cooler 2a.

The two semiconductor elements 7, which again are laser diode bars, each are fastened with their supporting plate 19 on the corresponding area 11a' in a suitable manner, and are series-connected with the wire bonds or other interior connectors 20 resp. 21 with the outer connectors 8 and 9 as well with each other.

As a further embodiment according to FIG. 7 shows a semiconductor module 1b, which differs from the semiconductor module 1a of FIGS. 4 and 5 substantially in that the corresponding supporting and connector plates 19 are not directly fastened to the relevant area 11a', but that between the supporting plate 19 and the area 11a' a peltier system 25 is provided which has at least one peltier element. The additional connectors 10, which according to the arrangement of FIG. 7 are provided one behind the other and of which only one is visible, are used for electrically supplying the peltier systems 25. The polarity of the peltier elements is chosen so that these elements act as a heat sink for the corresponding supporting plate 19, and conduct the heat loss from the corresponding supporting plate 19 or the corresponding semiconductor element 7 to the mnicro-cooler 2a. By using the peltier systems 25 not only an improved cooling effect is obtained, but with these elements it is also possible to maintain the operating temperature of the semiconductor elements 7 by means of a controlling process, which is substantially free of delays, a predetermined value, namely for the discharge of laser light with a constant spectrum.

FIG. 8 shows at an increased scale a partial representation of a duct or a connector 26 as it can be used instead of the connectors 8–10. The connector 26 consists substantially of a connector bolt 27 made of electrically conducting material, f.e. copper. This bolt has a section 27' with increased diameter and a section 27" with smaller diameter arranged coaxially with section 27'.

Section 27' which at its free end has an axial bore 28 with an inner thread, and which by means of a screw connection can be connected to an outer connector cable, forms that part of the electrical connector 26 which extends beyond the underside 2'. With section 27" the connector bolt 27 is passed through the micro-cooler 2 and extends with it's upper side 2' of this cooler into the interior space 6 of the casing. The metal layer, such as metal layer 11, forming the underside 2" is structured in such a manner that adjacent the connector 26 it forms an area 11" which is electrically separated from the remaining part of the metal layer 11. In the same manner the metallic layer 11 at the upper side 2' of the micro-cooler 2 is structured so that an area 11'" is formed theron, too, which is electrically separated from the remaining part of the metal layer 11. With the shown embodiment areas 11" and 11'" are circular.

Each area 11" and 11'" is provided with a bore 29 or 30, just as the joining ceramic layer 12. The coincidently arranged bores 29 and 30 have the same diameter which corresponds with the outer diameter of section 27". Within the adjacent layers 13 and 15 forming the active area 14 of the micro-cooler 2, a through-bore 31 is provided which has a diameter larger than the outer diameter of section 27". The annular space surrounding the section 27" within the bore 31 is filled by a sleeve 32 surrounding section 27", which sleeve is made of electrically insulating material, f.e. ceramic or plastic.

The joining bolt 27 is connected with the area 11" at the step formed between the sections 27' and 27", for example by soldering, by direct bonding or in any other suitable manner. Furthermore, the bolt section is connected with area 11'" by soldering.

As a further possible embodiment FIG. 9 shows an electrical connector 26a, which similar to the connector 26 for example in connection with the semiconductor module 1 can be used instead of the connectors 8–10, and which differs from connector 26 in that instead of the connector bolt 27 a connector bolt 27a is used, which altogether has three sections, one of which in FIG. 9 is the upper section 27a' extending beyond the upper side 2' of the micro-cooler 2 within the interior space of the casing, joined by section 27a" with an increased diameter which section contacts the upper side of the area 11'" and is connected for example by soldering or direct bonding or in any other suitable manner therewith, and section 27a'", which is passed through the micro-cooler and extends beyond the underside 2" of the micro-cooler.

Connector 26a has the advantage over connector 26 that by connecting the bolt section 27a" with the area 11'" a sealing of the ducting of the connector bolt 27a is obtained with in the plane, which is also the separation plane between the interior space 6 of the casing and the cooling, and that a second connection of the bolt 27a with area 11" is not required.

The connectors 26 and 26a shown in FIGS. 8 and 9 allow also a direct connection to the connecting and fixing areas 11' and 11a' without the necessity of an interior connector 20 because the area 11'" is part of the area 11' resp. 11a', or because by suitably structuring the metal layer 11 is part of a conductor connected with the area 11'.

With the connectors 26 and 26a it is also possible to dispense with the sleeves 32.

From the manufacturing point of view it can also be useful to fasten the semiconductor elements 7 fixed with the corresponding connector and supporting plate 19 by means of screw fasteners onto the area 11' or 11a'. This way of fastening then is to be made in such a manner that inspite of sufficient pressing force of plate 19 against the area 11' or 11a' there is no electrical connection with the metal layers of the micro-cooler 2 or 2a through the fastening elements (f.e. screws) and the associated threads.

FIG. 10 shows a possible embodiment for a screw connector. A substantial constituent of this connector is a female thread piece 33 made from electrically insulating material, preferably from ceramic. The female thread piece 33 is arranged within a recess 34 formed as a blind bore, the recess is formed within several layers 15 which join the upper layer 13 of the micro-cooler 2 resp. 2a. The female thread piece 33 is arranged with the axis of its interior thread rectangular to the upper or lower side of the micro-cooler. Coaxially with the axis of the female thread piece 33 are provided bores 35, 36 and 37 within the metal layer 13, the ceramic layer 12 above layer 13, and the sections 11' resp. 11a' of the metal layer 11 arranged above layer 12. The bores 35 and 37 have a larger diameter than bore 36, the diameter of all bores 35–37 is smaller than the outer diameter of the female thread piece 33, and is larger than the diameter of the thread bore 33' of said female thread piece.

As shown in the drawings the outer diameter of the female thread piece 33 is smaller than the diameter of recess 34. Furthermore, the axial length of the female thread piece 33 is smaller than the depth of the recess 34 so that the female thread piece 33 contacting the underside of the metal layer 13 at its face and fixed there for example by direct bonding is arranged distant from the peripheral wall of recess 34 as well from the bottom of said recess.

FIG. 10 shows that a fastening screw 38 by means of which the supporting plate 19 is mounted onto the area 11' or 11a'. Screw 38 engages the thread 33' with its shaft, and with its head contacts the upper side of plate 19.

A further embodiment FIG. 11 shows a semiconductor module 1c which differs from the semiconductor modules 1–1b insofar as no connectors 8–10 or 26, 26a passing through the micro-cooler 2 are provided, but connectors 39 are arranged at the upper side of the semiconductor module 1c or the micro-cooler 2. With this embodiment the micro-cooler 2c, the structure of which basically corresponds to micro-cooler 2, is designed in such a manner that at least at two opposite sides it extends beyond the casing 3. The metal layer 11 is structured so that it forms conductor paths 11"" which extend up to the edge of the micro-cooler at positions, where said micro-cooler extends laterally beyond the casing 3. A further ceramic layer 40 is provided upon the metal layer 11, and on top of said ceramic layer 40 a further metal layer 41 is arranged. The metal layer 41 with which the casing 3 with its free edge of the peripheral wall 5 is sealingly connected, by corresponding structuring measures forms areas 41' on the one hand, which in view of their function correspond to areas 11', and on the other hand forms contact surfaces 41", which by means of the wire bonds or internal connectors 20 are connected with the structural elements 7 or the connector and supporting plates 19 thereof. By through-contacts 42 the areas 41 are connected with a conductor 11"", which itself is connected outside of the casing with one of the pin-type connectors 39, which extend beyond the upper side 2c' of the micro-cooler 2c. The areas 41' and 41" are electrically insulated by structuring the metal layer 41 against the remaining part of said metal layer.

Suitable ceramic materials according to the invention are in general $Al_2O_3$, AlN, BeO, CBN, $Si_3N_4$ and SiC.

Suitable metals for the metal layers are copper and copper alloys, f.e. copper-tungsten, as well aluminum and aluminum alloys.

The thickness of the layers 13 and 15 for example is in the range between 200–1000 μm. The remaining layers for example have a thickness of 200–600 μm, whereby the thickness of the support or contact plates 19 for example is substantially larger in thickness than that of the associated contact areas 11', 11a' or 41'.

Above, the invention has been described by various embodiments. It is to be understood that numerous further alterations and deviations will be possible without leaving the basic inventive idea.

For example, it is possible to arrange one or a plurality of connectors formed as insulating ducts on the casing 3, as this has been shown in FIG. 1 for the connector 43, which by using an insulation 44 consisting of glass is passed through the wall 5 of the housing. The connector 43 for example is used as a logical connector or as a connector for control signals and is connected with the interior volume of the casing through a connection 45 with a semiconductor element 7, for example with a control connector or a gate of said structural element. Preferably, the housing 3 with this embodiment is made in two parts and comprises a frame-type peripheral wall 5 of the housing and the bottom 4 of the housing which is sealingly connected with the wall 5 of the housing, for example by roll-welding.

List of Reference Numerals 1, 1a, 1b, 1c Semiconductor module
2, 2a, 2c micro-cooler
2', 2a', 2c' upper side of micro-cooler
2", 2a", 2c" bottom side of micro-cooler
3 housing
4 bottom of housing
5 peripheral wall of housing
5' edge of housing
6 interior volume of housing
7 semiconductor element resp. laser diode
8–10 internal electrical connector
11 metal layer
11', 11", 11"' area
11"" connector conductor path
11a' area
12, 12a ceramic layer
13 metallic layer
14 structured area of micro-cooler
15 structure metal layer
16 column
17, 18 connector for leading circuit and following circuit of cooling medium
19 supporting and contacting plate
20/21 internal connection
22 bore
23 insert of insulating material, f.e. ceramic
24 exit window for laser light
25 peltier system
26, 26a electrical connector
27, 27a connecting bolt
27', 27", 27a' bolt section
27a", 27a"' bolt section
28 thread bore
29–31 bore
32 sleeve
33 female thread piece of insulating material, preferably ceramic
33' tap hole
34 recess
35–37 bore
38 fastening screw
39 connector bolt
40 ceramic layer
41 metal layer
41', 41" area
42 through-contacting
43 connector
44 insulated duct for connector 43
45 internal connector

What is claim is:

1. A semiconductor module comprising at least one semiconductor element formed as a laser diode or a laser diode system, whereby the semiconductor element is provided on an area of a multi-layer substrate, which at least in a partial area is formed as a micro-cooler through which a cooling medium is passed, and which is provided with terminals for supplying and discharging the cooling medium, wherein said at least one semiconductor element is arranged within a space, which is separated from the cooling medium terminals and can be hermetically locked, wherein the multi-layer substrate is designed symmetrically to a center plane (M) extending parallel to the upper surfaces of the substrate.

2. The semiconductor module according to claim 1, wherein the at least one semiconductor element is arranged within the interior space of a casing, and wherein the casing with a wall of the casing restricting the interior space of the casing tightly connected with an upper side of the multi-layer substrate or the micro-cooler.

3. The semiconductor module according to claim 2, wherein the upper side of the multi-layer substrate is a metallic layer.

4. A semiconductor module comprising at least one semiconductor element formed as a laser diode or a laser diode system, whereby the semiconductor element is provided on an area of a multi-layer substrate, which at least in a partial area is formed as a micro-cooler through which a cooling medium is passed, and which is provided with terminals for supplying and discharging the cooling medium, wherein said at least one semiconductor element is arranged within a space, which is separated from the cooling medium terminals and can be hermetically locked, wherein the at least one semiconductor element is arranged within the interior space of a casing, with a wall of the casing restricting the interior space of the casing tightly connected with an upper side of the multi-layer substrate or the micro-cooler, wherein at least one fastening area is formed on the upper side of the multi-layer substrate within the interior of the casing, on which the at least one semiconductor element is provided, and which is electrically separated from further layers of the multi-layer substrate by means of a ceramic layer.

5. The semiconductor module according to claim 4, wherein the at least one semiconductor element is fastened onto a supporting plate, and said supporting plate is mounted in contact along its surface within the fastening area.

6. The semiconductor module according to claim 5, wherein fastening is performed by at least one fastening element engaging said multi-layer substrate, said fastening means being electrically insulated with respect to other areas or portions of the multi-layer substrate.

7. The semiconductor module according to claim 4, wherein within the multi-layer substrate an anchoring element, formed as a female thread unit of electrically insulating material is provided for the at least one fastening element.

8. The semiconductor module according to claim 4, wherein the entire surface of the at least one fastening area is substantially smaller than the interior surface of the micro-cooler structure through which the cooling medium is passed.

9. The semiconductor module according to claim 1, wherein the cooling medium terminals are provided on one side of said substrate different from the upper side of the substrate.

10. The semiconductor module according to claim 9, wherein the cooling medium terminals are provided at the underside of the substrate.

11. A semiconductor module comprising at least one semiconductor element formed as a laser diode or a laser diode system, whereby the semiconductor element is provided on an area of a multi-layer substrate, which at least in a partial area is formed as a micro-cooler through which a cooling medium is passed, and which is provided with terminals for supplying and discharging the cooling medium, wherein said at least one semiconductor element is arranged within a space, which is separated from the cooling medium terminals and can be hermetically locked, wherein the at least one semiconductor element is arranged within the interior space of a casing, with a wall of the casino restricting the interior space of the casing tightly connected with an upper side of the multi-layer substrate or the micro-cooler, wherein electrical connectors extend through the multi-layer substrate at the underside of the substrate, electrically insulated from the interior space of the casing.

12. The semiconductor module according to claim 11, whereby the electrical connectors are passed through the areas of the substrate not including the micro-cooler.

13. The semiconductor module according to claim 11, wherein at least one insertion unit made of electrically insulated material is provided within the area of passing through the electrical connectors.

14. A semiconductor module comprising at least one semiconductor element formed as a laser diode or a laser diode system, whereby the semiconductor element is provided on an area of a multi-layer substrate, which at least in a partial area is formed as a micro-cooler through which a cooling medium is passed, and which is provided with terminals for supplying and discharging the cooling medium, wherein said at least one semiconductor element is arranged within a space, which is separated from the cooling medium terminals and can be hermetically locked, wherein a plurality of electrically insulated fastening areas are formed at the upper side of the multi-layer substrate.

15. The semiconductor module according to claim 14, wherein the plurality of electrically insulated fastening areas are formed by structuring the metal layer forming the upper side and provided on a ceramic layer.

16. The semiconductor module according to claim 2, wherein the casing is made of metal or plastics material with metallization.

17. The semiconductor module according to claim 2, wherein the casing is connected to the multi-layer substrate by direct bonding.

18. A semiconductor module comprising at least one semiconductor element formed as a laser diode or a laser diode system, whereby the semiconductor element is provided on an area of a multi-layer substrate, which at least in a partial area is formed as a micro-cooler through which a cooling medium is passed, and which is provided with terminals for supplying and discharging the cooling medium, wherein said at least one semiconductor element is arranged within a space, which is separated from the cooling medium terminals and can be hermetically locked, wherein the area forming the micro-cooler is comprised of a plurality of metal layers connected along their surfaces, including two outer metallic layers and inner metal layers arranged therebetween for forming the micro-cooler structure with a flow path for the cooling medium, which branches off in at least two perpendicular directions with a plurality of apertures and bridges therebetween.

19. The semiconductor module according to claim 18, wherein the outer metal layers of the micro-cooler at both sides are followed by at least one ceramic layer each, and the ceramic layer is joined by at least a further metallic layer.

20. The semiconductor module according to claim 19, wherein the further metallic layer at one side of the substrate forms the upper side thereof.

21. The semiconductor module according to claim 19, wherein the further metallic layer is followed by an additional ceramic layer and the additional ceramic layer is followed by an additional metallic layer.

22. The semiconductor module according to claim 21, wherein the additional metallic layer on one side of the substrate forms the upper side thereof.

23. The semiconductor module according to claim 18, wherein the layers of the micro-cooler are connected with each other by means of the direct bonding technique.

24. The semiconductor module according to claim 18, wherein the metal layers are at least partially made from copper, aluminum, or copper tungsten.

25. The semiconductor module according to claim 24, wherein at least those layers forming the micro-cooler structure are layers made from copper.

26. The semiconductor module according to claim 19, wherein the ceramics material is $Al_2O_3$, AlN, BeD, CBN, $Si_3N_4$ or SiC.

27. The semiconductor module according to claim 18, wherein the metal layers forming the micro-cooler structure have a thickness in the range between 200 and 600 mm.

28. The semiconductor module according to claim 27, wherein the remaining metal layers have a thickness in the range between 200 and 1000 mm.

29. A semiconductor module comprising at least one semiconductor element formed as a laser diode or a laser diode system, whereby the semiconductor element is provided on an area of a multi-layer substrate, which at least in a partial area is formed as a micro-cooler through which a cooling medium is passed, and which is provided with terminals for supplying and discharging the cooling medium, wherein said at least one semiconductor element is arranged within a space, which is separated from the cooling medium terminals and can be hermetically looked, wherein the at least one semiconductor element is arranged within the interior space of a casing, with a wall of the casing restricting the interior space of the casing tightly connected with an upper side of the multi-layer substrate or the micro-cooler, wherein at least one electrical connector extends laterally from the substrate or from the upper side of the substrate outside of the casing.

30. A semiconductor module comprising at least one semiconductor element formed as a laser diode or a laser diode system, whereby the semiconductor element is provided on an area of a multi-layer substrate, which at least in a partial area is formed as a micro-cooler through which a cooling medium is passed, and which is provided with terminals for supplying and discharging the cooling medium, wherein said at least one semiconductor element is arranged within a space, which is separated from the cooling medium terminals and can be hermetically locked, wherein the at least one semiconductor element is arranged within the interior space of a casing, with a wall of the casing restricting the interior space of the casing tightly connected with an upper side of the multi-layer substrate or the micro-cooler, further comprising a plurality of structural elements within the casing, said structural elements are electrically connected in series.

31. The semiconductor module according to claim 5, wherein a peltier device with at least one peltier element is provided between the at least one semiconductor element and connector plate thereof and the fastening area.

32. The semiconductor module according to claim 2, wherein at least one window is provided within the casing for the exit of a laser beam.

33. A semiconductor module comprising at least one semiconductor element formed as a laser diode or a laser diode system, whereby the semiconductor element is provided on an area of a multi-layer substrate, which at least in a partial area is formed as a micro-cooler through which a cooling medium is passed, and which is provided with terminals for supplying and discharging the cooling medium, wherein said at least one semiconductor element is arranged within a space, which is separated from the cooling medium terminals and can be hermetically locked, wherein the at least one semiconductor element is arranged within the interior space of a casing, with a wall of the casing restricting the interior space of the casing tightly connected with an upper side of the multi-layer substrate or the micro-cooler, wherein within a peripheral wall of the casing surrounding the interior space of the casing at least one connector is provided, which is formed as an electrical bushing.

34. The semiconductor module according to claim 33, wherein the connector is passed through the casing or the peripheral wall of the casing by using an insulating bushing.

* * * * *